(12) United States Patent
Ishii et al.

(10) Patent No.: US 10,335,837 B2
(45) Date of Patent: Jul. 2, 2019

(54) SUBSTRATE PROCESSING APPARATUS

(71) Applicant: SCREEN Holdings Co., Ltd., Kyoto (JP)

(72) Inventors: Junichi Ishii, Kyoto (JP); Koichi Okamoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/767,014

(22) PCT Filed: Nov. 1, 2013

(86) PCT No.: PCT/JP2013/079715
§ 371 (c)(1),
(2) Date: Aug. 11, 2015

(87) PCT Pub. No.: WO2014/125681
PCT Pub. Date: Aug. 21, 2014

(65) Prior Publication Data
US 2015/0375273 A1     Dec. 31, 2015

(30) Foreign Application Priority Data

Feb. 14, 2013   (JP) .................................. 2013-026282

(51) Int. Cl.
*B08B 3/14*     (2006.01)
*B01D 19/00*   (2006.01)
(Continued)

(52) U.S. Cl.
CPC ............ *B08B 3/14* (2013.01); *B01D 19/0031* (2013.01); *B01D 35/02* (2013.01);
(Continued)

(58) Field of Classification Search
CPC ...... B08B 3/14; B01D 19/0031; B01D 35/02; H01L 21/67017; H01L 21/67023; H01L 21/67051; H01L 21/6708
(Continued)

(56) References Cited

U.S. PATENT DOCUMENTS 5,134,962 A * 8/1992 Amada .................... B05C 11/08
                                                                    118/320
5,931,349 A * 8/1999 Yoo ..................... B01D 19/0031
                                                                    137/171
(Continued)

FOREIGN PATENT DOCUMENTS

CN     1509199     6/2004
CN     1607975     4/2005
(Continued)

OTHER PUBLICATIONS

Search Report issued by European Patent Office dated Aug. 27, 2015 in connection with corresponding European application No. PCT/JP2013/079715.
(Continued)

*Primary Examiner* — Michael E Barr
*Assistant Examiner* — Tinsae B Ayalew
(74) *Attorney, Agent, or Firm* — Ostrolenk Faber LLP

(57) ABSTRACT

A technique for reducing the amount of particles adhering to a substrate with a simple structure is provided. A substrate processing apparatus is an apparatus for processing a substrate by ejecting a processing liquid from a nozzle. The substrate processing apparatus includes supply piping and an air-bubble capturing part. One end of the supply piping is connected via a first filter for removing particles to a tank of a processing-liquid supply part that supplies the processing liquid, and the other end of the supply piping is connected to the nozzle. The air-bubble capturing part is inserted at a
(Continued)

position between the first filter and the nozzle in the supply piping, and captures air bubbles contained in the processing liquid. Pressure loss caused by the air-bubble capturing part is approximately equal to or smaller than pressure loss caused by the first filter.

9 Claims, 10 Drawing Sheets

(51) Int. Cl.
*B01D 35/02* (2006.01)
*H01L 21/67* (2006.01)

(52) U.S. Cl.
CPC .... *H01L 21/6708* (2013.01); *H01L 21/67017* (2013.01); *H01L 21/67023* (2013.01); *H01L 21/67051* (2013.01)

(58) Field of Classification Search
USPC ......................................................... 134/110
See application file for complete search history.

(56) References Cited

U.S. PATENT DOCUMENTS

| | | | |
|---|---|---|---|
| 6,214,129 B1 | 4/2001 | Nakaoka et al. | |
| 2002/0124798 A1* | 9/2002 | Kitano | G03F 7/16 118/300 |
| 2004/0144736 A1* | 7/2004 | Yajima | B01D 19/0068 210/805 |
| 2005/0068394 A1* | 3/2005 | Inoue | B41J 2/175 347/93 |
| 2005/0175472 A1 | 8/2005 | Udagawa | |
| 2005/0227172 A1* | 10/2005 | Ozaki | G03F 7/0392 430/270.1 |
| 2007/0007196 A1* | 1/2007 | Komatsu | B01D 61/00 210/500.1 |
| 2008/0053493 A1 | 3/2008 | Kimura | 134/104.4 |
| 2010/0083985 A1 | 4/2010 | Numanami | |
| 2010/0229726 A1* | 9/2010 | Nishimura | G11B 7/266 118/52 |

FOREIGN PATENT DOCUMENTS

| | | |
|---|---|---|
| CN | 1221300 C | 10/2005 |
| CN | 101716581 | 6/2010 |
| JP | 8-323106 | 12/1996 |
| JP | 11-195632 | 7/1999 |
| JP | 2001-155985 | 6/2001 |
| JP | 2002-035704 | 2/2002 |
| JP | 2007-258367 | 10/2007 |
| JP | 2008-066351 | 3/2008 |
| JP | 2009-021448 | 1/2009 |
| JP | 2010-117403 | 5/2010 |
| JP | 2011-088109 | 5/2011 |
| JP | 2011-88109 A | 5/2011 |
| TW | 505707 | 12/1997 |
| TW | 200812708 | 1/2006 |

OTHER PUBLICATIONS

International Preliminary Report on Patentability dated Aug. 27, 2015 in connection with corresponding application No. PCT/JP2013/079715.
Office Action dated Jun. 24, 2015 by Taiwanese Patent Office in connection with corresponding Taiwanese Application No. 102146259 and Japanese & English translations.
International Search Report dated Nov. 26, 2013 in corresponding PCT International Application No. PCT/JP2013/079715.
Japanese Office Action (JP Application No. 2013-026282) dated Sep. 20, 2016 and its partial English translation.
Office Action dated Dec. 16, 2016 by the Chinese Patent Office in connection with corresponding Chinese Patent Application No. 2013-80072994.1 and its partial English translation.
Office Action dated Dec. 15, 2016 by the Japanese Patent Office in connection with corresponding Japanese Patent Application No. 2013-026282 and its partial English translation.
Jul. 17, 2017 Office Action in corresponding Chinese App. 201380072994.1 with partial English translation of same.
Office Action dated Dec. 16, 2017 in corresponding Korean Patent Application No. 10-2015-7021533 with partial English translation.

* cited by examiner

F I G. 1
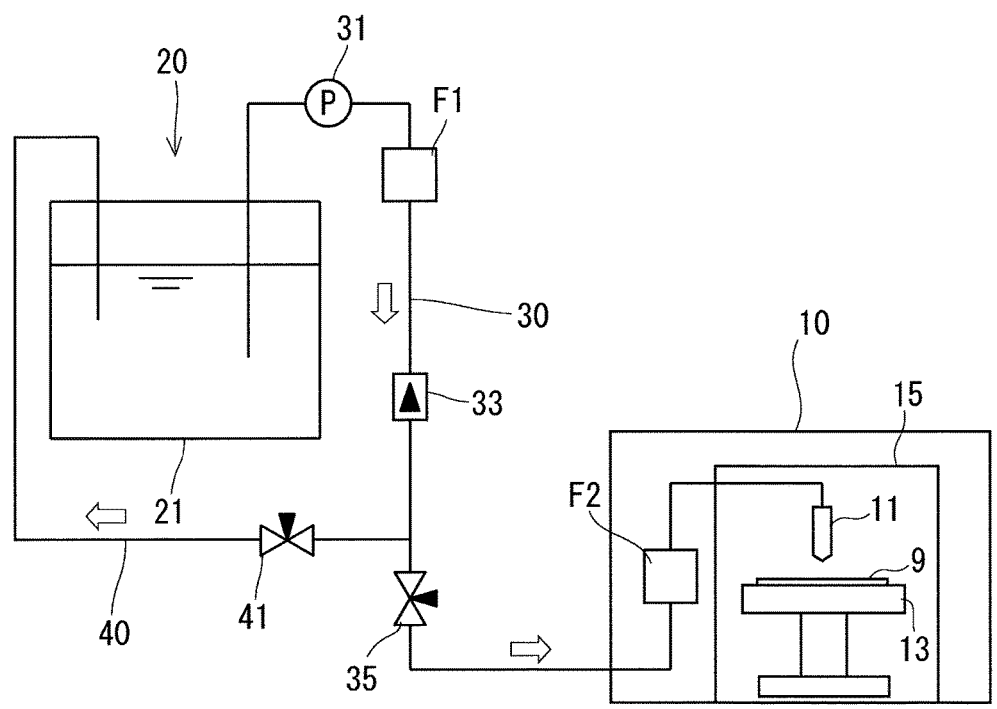

F I G. 2
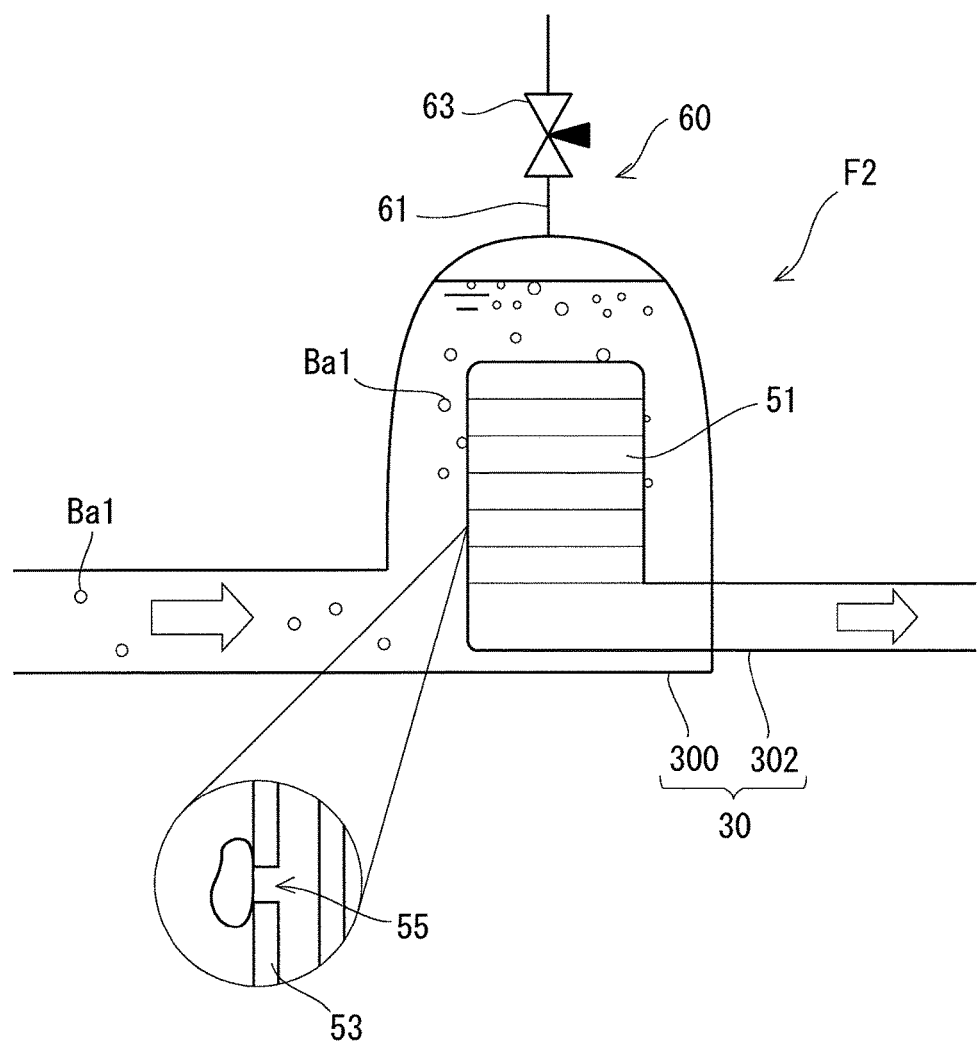

F I G. 3
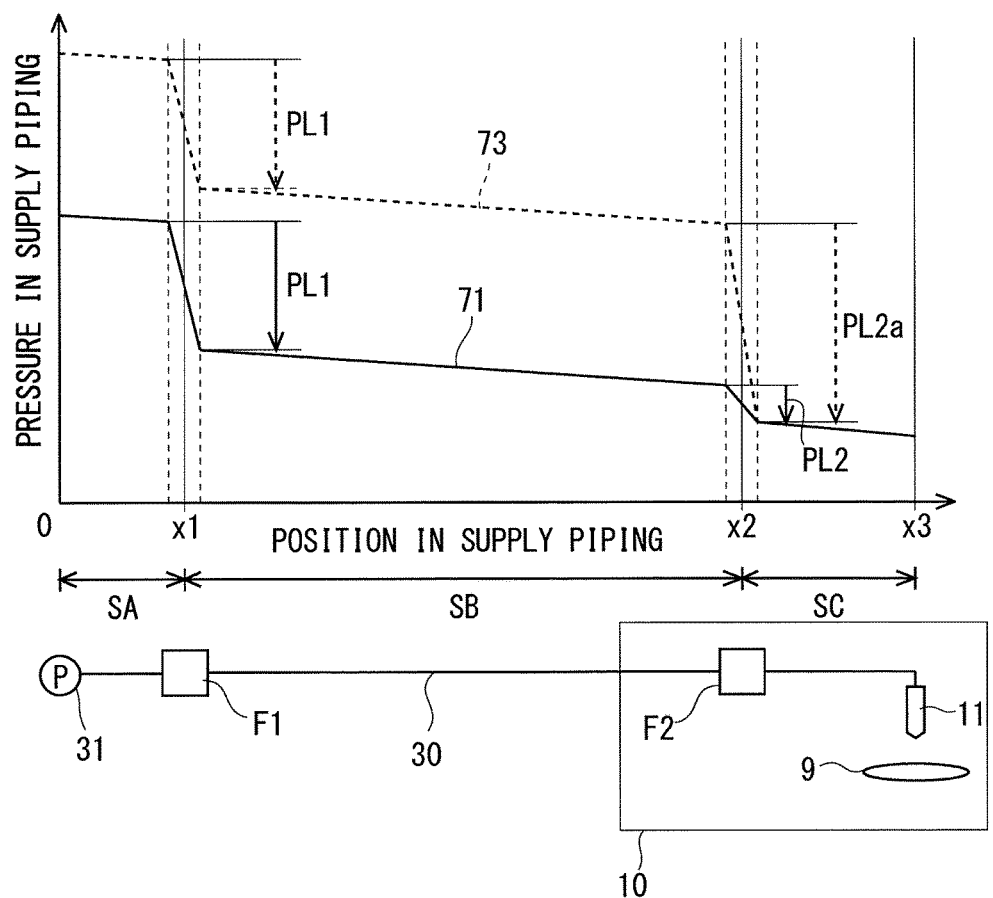

F I G. 4
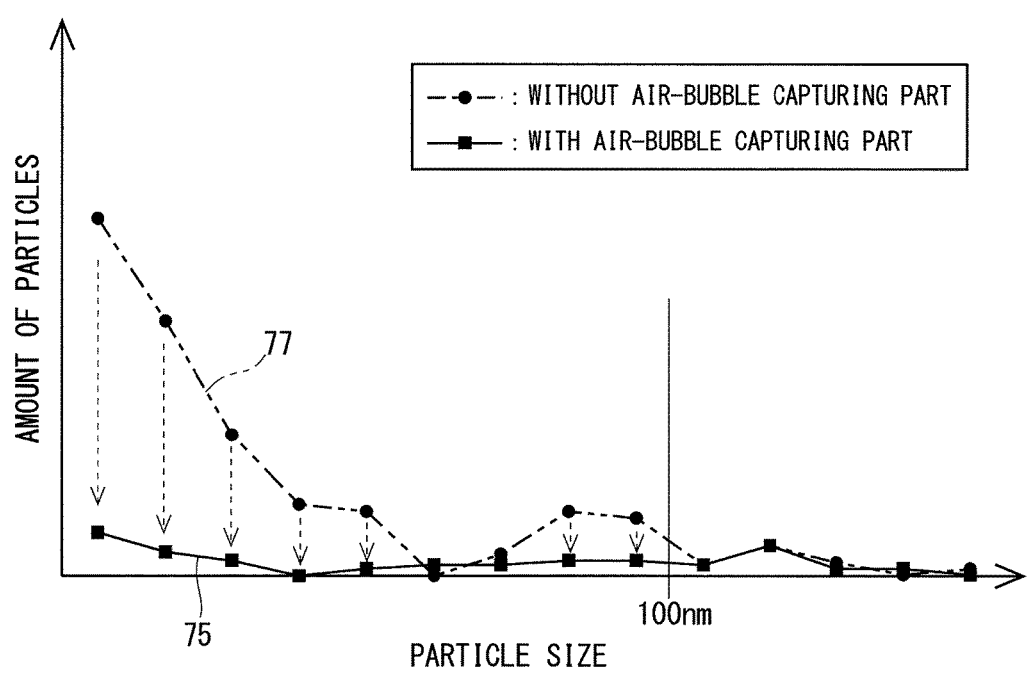

SUBSTRATE PROCESSING APPARATUS

CROSS-REFERENCE TO RELATED APPLICATIONS

The present application is a 35 U.S.C. §§ 371 national phase conversion of PCT/JP2013/079715, filed Nov. 1, 2013, which claims priority to Japanese Patent Application No. JP2013-026282, filed Feb. 14, 2013, the contents of which are incorporated herein by reference. The PCT International Application was published in the Japanese language.

TECHNICAL FIELD

The present invention relates to a substrate processing apparatus for processing a substrate, and in particular to a technique for reducing the amount of particles adhering to a substrate.

BACKGROUND ART

To reduce particles adhering to a substrate, there have conventionally been cases where a filter having a pore diameter that matches the size of particles to be captured is inserted in piping for the purpose of removing particles contained in a processing liquid (e.g., Patent Literature 1).

PRIOR ART LITERATURE

Patent Literature

Patent Literature 1: Japanese Patent Application Laid-Open No. 2008-66351

SUMMARY OF INVENTION

Problems to be Solved by Invention

However, pressure loss to be caused in piping increases if a filter with a small pore diameter is provided to remove smaller particles or if a plurality of filters are provided. It is thus conceivable to use a high-performance pump to enable high-pressure liquid transmission, but this causes various problems such as upsizing of the pump, an increase in drive energy such as electric power consumed by the pump, and a rise in cost. It is also conceivable to increase the size of a filter to reduce pressure loss, but this causes another problem, i.e., constraints on the position to mount the filter.

If the pressure loss increases, air bubbles 101 are likely to occur in the processing liquid due to a rapid pressure drop in piping downstream of the filter (see FIG. 10). As illustrated in FIG. 10, there are cases where generated air bubbles 101 have a large number of particles 103 adhering to and aggregating on their interfaces. Thus, a problem also arises in which the air bubbles 101 having a large number of particles 103 adhering thereto come in contact with the surface of a substrate 109 and accordingly increase the amount of particles adhering to the surface of the substrate 109.

There is thus demand for a technique for suppressing adhesion of particles to a substrate with a relatively simple structure.

The present invention has been achieved in view of the above-described problems, and it is an object of the present invention to provide a technique for reducing the amount of particles adhering to a substrate with a simple structure.

Means for Solving Problems

To solve the above-described problems, a first aspect describes a substrate processing apparatus for processing a substrate by ejecting a processing liquid. The substrate processing apparatus includes an ejection part that ejects a processing liquid toward the substrate, supply piping having one end connected to a processing-liquid supply part via a first filter and the other end connected to the ejection part, the processing-liquid supply part supplying the processing liquid, and the first filter removing particles, and an air-bubble capturing part that is inserted at a position between the first filter and the ejection part in the supply piping and captures air bubbles contained in the processing liquid. Pressure loss caused by the air-bubble capturing part is approximately equal to or smaller than pressure loss caused by the first filter.

A second aspect describes the substrate processing apparatus of the first aspect in which the air-bubble capturing part includes a second filter, and the second filter has a pore diameter greater than a pore diameter of the first filter.

A third aspect describes the substrate processing apparatus of the first aspect in which the air-bubble capturing part includes a hollow fiber membrane.

A fourth aspect describes the substrate processing apparatus of any one of the first to third aspects in which a distance from the air-bubble capturing part to the ejection part in the supply piping is shorter than a distance from a pressure source to the air-bubble capturing part in the supply piping, the pressure source applying pressure to the processing liquid.

Advantageous Effects of Invention

In the substrate processing apparatus according to the first aspect, the air-bubble capturing part can capture air bubbles generated in the processing liquid that has passed through the first filter. This reduces the possibility that air bubbles with particles adhering thereto will adhere to the substrate. Also, the generation of air bubbles in the processing liquid that has passed through the second filter can be suppressed by making the pressure loss caused by the air-bubble capturing part approximately equal to or smaller than the pressure loss caused by the first filter. This reduces the amount of particles adhering to the substrate.

According to the second aspect, the pore diameter of the second filter is made greater than the pore diameter of the first filter. It is thus possible to reduce the pressure loss caused by the second filter to be smaller than the pressure loss caused by the first filter.

In the substrate processing apparatus according to the third aspect, air bubbles can be captured by the hollow fiber membrane, and the pressure loss caused by the air-bubble capturing part can be reduced. This suppresses the generation of air bubbles in the processing liquid that has passed through the air-bubble capturing part, thus reducing the amount of particles adhering to the substrate.

In the substrate processing apparatus according to the fourth aspect, the air-bubble capturing part is located close to the ejection port. This suppresses the generation of air bubbles in the processing liquid that flows from the air-bubble capturing part to the ejection port, thus reducing the amount of particles adhering to the substrate.

BRIEF DESCRIPTION OF DRAWINGS

FIG. 1 is a general view illustrating an overview of a substrate processing apparatus and a processing-liquid supply part according to a first embodiment.

FIG. 2 is a side view of an air-bubble capturing part according to the first embodiment.

FIG. 3 depicts graphs showing the pressure at each position in supply piping.

FIG. 4 depicts graphs showing the amount of particles adhering to a substrate processed by the substrate processing apparatus.

DESCRIPTION OF EMBODIMENTS

Figure 5:
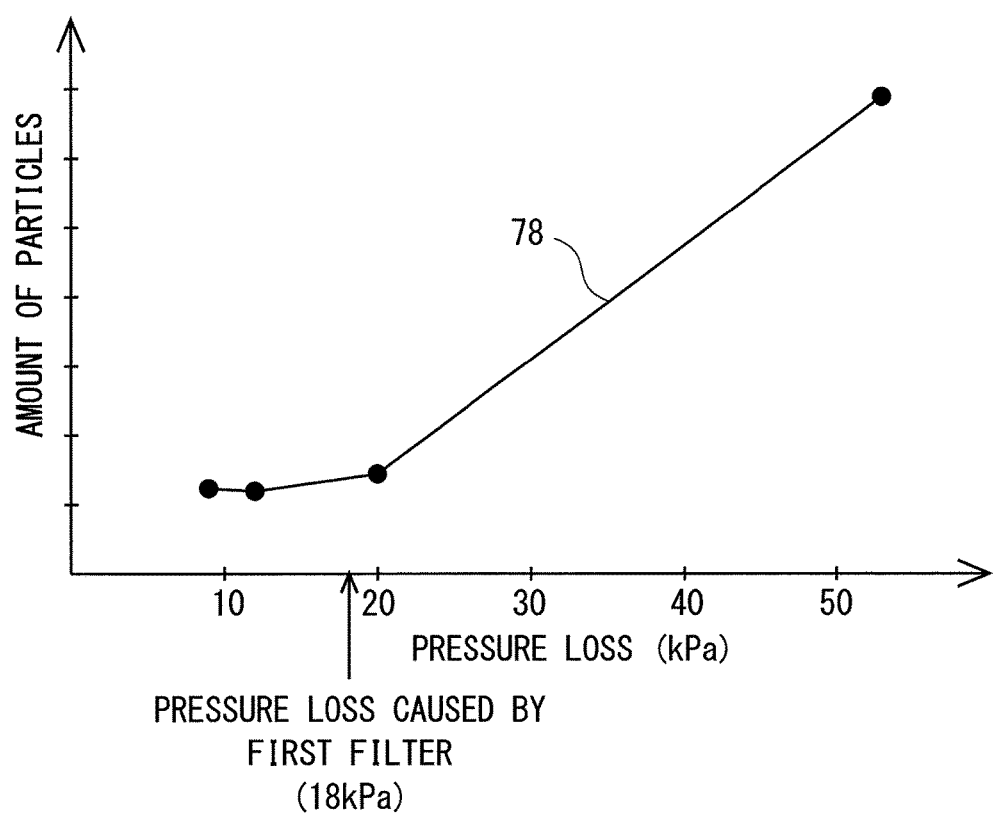
FIG. 5 depicts a graph showing a correlation between the pressure loss caused by a second filter and the amount of particles adhering to the substrate.

Now, embodiments of the present invention will be described with reference to the attached drawings. Note that the following embodiments are exemplary embodiments of the present invention and are not intended to limit the technical scope of the present invention. For easy understanding of the drawings, the dimension and number of each constituent element are sometimes illustrated in an exaggerated or simplified manner as necessary in the attached drawings.

1. First Embodiment

FIG. 1 is a general view illustrating an overview of a substrate processing apparatus 10 and a processing-liquid supply part 20 according to a first embodiment. The substrate processing apparatus 10 performs processing on a substrate 9 by supplying a processing liquid supplied from the processing-liquid supply part 20 to the substrate 9 that is held on a rotation stage 13. The rotation stage 13 incorporates a motor therein, which is not shown. The substrate processing apparatus 10 spreads the processing liquid over the entire substrate 9 by supplying the processing liquid from a nozzle 11 (ejection part) to the vicinity of the center of the substrate 9 while causing the rotation stage 13 to rotate the substrate 9. Accordingly, processing using the processing liquid is performed on the substrate 9. The substrate processing apparatus 10 is, for example, an apparatus that performs etching, cleaning, and other processing on the substrate 9. Note that in the substrate processing apparatus 10, the nozzle 11 and the rotation stage 13 are configured such that a substrate is processed inside a chamber 15.

To be more specific, when the substrate processing apparatus 10 performs processing for removing particles from the surface of the substrate 9, a processing liquid such as an ammonia-hydrogen peroxide mixture (SC1) is supplied from the processing-liquid supply part 20 to the substrate processing apparatus 10. When the substrate processing apparatus 10 performs processing for etching an oxide film or other films from the surface of the substrate 9, hydrofluoric acid or buffered HF (BHF) is supplied. When the substrate processing apparatus 10 performs processing for stripping a resist film formed on the surface of the substrate 9 or processing for removing resist residues remaining in the form of a polymer on the surface of the substrate 9 after stripping of the resist film, a resist stripper such as a sulfuric acid/hydrogen peroxide mixture (SPM) or an ammonia-hydrogen peroxide mixture (SC1), or a polymer remover is supplied. For cleaning processing for removing metal pollutants, hydrofluoric acid, a hydrochloric acid/hydrogen peroxide mixture (SC2), or SPM is supplied. Alternatively, a rinsing liquid such as isopropyl alcohol (IPA) or deionized water (DIW) may be supplied from the processing-liquid supply part 20 to the substrate processing apparatus 10.

A tank 21 and the nozzle 11 are connected in communication with each other through supply piping 30. In other words, one end of the supply piping 30 is connected to the tank 21 of the processing-liquid supply part 20, and the other end of the supply piping 30 is connected to the nozzle 11. The supply piping 30 is made of stainless steel or a resin, for example. In the route of the supply piping 30, a pump 31, a first filter F1, a flowmeter 33, a supply valve 35, and an air-bubble capturing part F2 are inserted in order from the side close to the tank 21. Note that the arrangement order of these constituent elements in the route of the supply piping 30 can be changed as desired. For example, a variation is possible in which the first filter F1 is provided between the flowmeter 33 and the supply valve 35. It is, however, noted that the air-bubble capturing part F2 is located between the first filter F1 and the nozzle 11.

The pump 31 constitutes a pressure source that transmits a processing liquid stored in the tank 21 toward the nozzle 11 under pressure. The flowmeter 33 measures the flow rate of the processing liquid flowing through the supply piping 30. The supply valve 35 controls the supply of the processing liquid to the nozzle 11 by opening or closing the flow path of the supply piping 30.

The supply piping 30 branches off from the route and is connected to circulating piping 40. The root end of the circulating piping 40 is connected to the supply piping 30 at a position between the flowmeter 33 and the supply valve 35, and the front end thereof is connected to the tank 21. A circulating valve 41 is inserted in the circulating piping 40.

The circulating valve 41 opens or closes the flow path of the circulating piping 40. When the circulating valve 41 is open in a state in which the supply valve 35 closes the supply piping 30, the processing liquid flowing through the supply piping 30 flows into the circulating piping 40 and back to the tank 21. In this way, the circulating piping 40 that circulates the processing liquid allows the first filter F1 to always maintain cleanliness. Depending on the situation, the processing liquid in the tank 21 can be maintained at a constant temperature through heating or cooling. In general, air valves can be employed as the supply valve 35 and the circulating valve 41. Also, the supply valve 35 and the circulating valve 41 may be motor-operated valves or hand-operated valves.

The first filter F1 is provided primarily for the purpose of removing particles contained in the processing liquid. The pore diameter of the first filter F1 is not particularly limited, but it is possible to use a filter with a pore diameter in the range of 10 to 50 nm, for example.

FIG. 2 is a side view of the air-bubble capturing part F2 according to the first embodiment. As illustrated in FIG. 2, the air-bubble capturing part F2 is formed at the connection between a first piping part 300 and a second piping part 302 that constitute the supply piping 30. The second piping part 302 is inserted in and coupled to the first piping part 300.

The air-bubble capturing part F2 includes a second filter 51 that is mounted on the root end of the second piping part 302. The second filter 51 has a multilayer structure in which a plurality of hydrophobic films 53 made of, for example, polytetrafluoroethylene (Teflon (registered trademark)) are laminated at predetermined intervals. Note that the material for the films 53 can be selected as appropriate depending on, for example, the type of the processing liquid or other factors. The films 53 have a large number of pores 55 having a pore diameter of 100 nm, for example. The pore diameter of the second filter 51 is, however, not limited to this value, and the second filter 51 may have a larger pore diameter (e.g., 100 µm).

The second filter 51 of the air-bubble capturing part F2 is configured to have a larger pore diameter than the pore diameter of the first filter F1. The reason that the air-bubble capturing part F2 is configured in this way is because the objects to be captured by the air-bubble capturing part F2 are not particles but air bubbles Ba1. Specifically, air bubbles Ba1 of various sizes are generated as illustrated in FIG. 2 until the processing liquid that has passed through the first filter F1 reaches the air-bubble capturing part F2. The air bubbles Ba1 appear as a result that gases dissolved in the processing liquid can no longer be dissolved due to the pressure loss (pressure difference) caused by the first filter F1, the pressure loss caused by bending of the supply piping 30, or a change in the temperature of the processing liquid. The air-bubble capturing part F2 is configured to prevent passage of such air bubbles Ba1 with the second filter 51 and capture the air bubbles Ba1 (see the enlarged view in FIG. 2). The air bubbles Ba1 that could not pass through the second filter 51 rise upward and accumulate in the processing liquid, thereby forming a vapor phase in the upper end portion of the first piping part 300.

As illustrated in FIG. 2, the air-bubble capturing part F2 includes a deaerating mechanism 60. The deaerating mechanism 60 includes deaerating piping 61 whose root end is connected to the upper end of a housing part of the first piping part 300 in which the second filter 51 is housed, and a deaerating valve 63 that is inserted in the route of the deaerating piping 61. By opening the deaerating valve 63, the vapor phase formed in the first piping part 300 connects in communication with the deaerating piping 61. This allows the gases accumulating in the first piping part 300 to be released to the outside.

This deaerating mechanism 60 may also be provided in the first filter F1. The first filter F1 also captures air bubbles Ba1 generated in, for example, the tank 21, the supply piping 30 (from the tank 21 to the first filter F1), and the circulating piping 40. Thus, the deaerating mechanism 60 for discharging such captured air bubbles Ba1 may be provided in the first filter F1.

Another reason that the pressure loss caused by the second filter 51 of the air-bubble capturing part F2 is made smaller than the pressure loss caused by the first filter F1 is to make the pressure loss caused by the air-bubble capturing part F2 as small as possible. This will be described with reference to FIG. 3.

FIG. 3 depicts graphs showing the pressure at each position in the supply piping 30. In FIG. 3, the horizontal axis indicates the position in the supply piping 30, and the vertical axis indicates the internal pressure of the supply piping 30. In FIG. 3, it is assumed that the origin (0) is the position at which the pump 31 is inserted in the supply piping 30, x1 is the position at which the first filter F1 is provided, x2 is the position at which the air-bubble capturing part F2 is provided, and x3 is the position at which the nozzle 11 is provided. It is also assumed that the section from the pump 31 to the first filter F1 is a "section SA," the section from the first filter F1 to the air-bubble capturing part F2 is a "section SB," and the section from the air-bubble capturing part F2 to the nozzle 11 is a "section SC."

A graph 71 indicated by the solid line in FIG. 3 corresponds to a pressure change inside the supply piping 30 according to the present embodiment, i.e., indicates a pressure change inside the supply piping 30 when pressure loss PL2 caused by the air-bubble capturing part F2 is smaller than pressure loss PL1 caused by the first filter F1. On the other hand, a graph 73 indicated by the broken line indicates a pressure change inside the supply piping 30 in the case of using an air-bubble capturing part (not shown) that causes pressure loss PL2a greater than the pressure loss PL1 caused by the first filter F1.

As indicated by the graph 71, the pressure inside the supply piping 30 is highest at the position of the pump 31 (origin) and is lowest at the position x3 of the nozzle 11 after having suffered the pressure losses PL1 and PL2 caused at the positions x1 and x2 and the pressure losses in the sections SA, SB, and SC. For easy understanding, the pressure losses in the sections SA, SB, and SC are assumed to be uniform depending on the section length.

As indicated by the graph 73, the total pressure loss occurring in the supply piping 30 increases in the case of using the air-bubble capturing part that causes the pressure loss PL2a greater than the pressure loss PL1 of the first filter F1. Thus, the pump 31 needs to add greater pressure to the processing liquid to allow the nozzle 11 to eject the processing liquid. This requires improvements in the performance of the pump 31, thus increasing the size and cost of the pump 31, and increases the consumption of the drive energy (e.g., electric power) for driving the pump 31. Additionally, if the pressure loss PL2a caused by the air-bubble capturing part F2 increases, the air bubbles Ba1 will be easily generated in the processing liquid in the section SC from the air-bubble capturing part F2 to the nozzle 11. This causes a problem in that the amount of particles adhering to the substrate 9 increases. Accordingly, it is advantageous in terms of substrate processing to make the pressure loss PL2 caused by the air-bubble capturing part F2 as small as possible, as indicated by the graph 71.

It is desirable for the air-bubble capturing part F2 to be positioned as close as possible to the nozzle 11. The reason that the air-bubble capturing part F2 is provided in this way is because the amount of air bubbles Ba1 to be generated in the section SC from the air-bubble capturing part F2 to the nozzle 11 can be reduced by reducing the length of the section SC. Thus, the distance across the section SC (i.e., the distance from the air-bubble capturing part to the ejection part) is set to be at least shorter than the total distance between the sections SA and SB (i.e., the distance from the pressure source to the air-bubble capturing part).

In actuality, the processing-liquid supply part 20 is often installed at a position lower than the level (e.g., at another floor) at which the substrate processing apparatus 10 is installed. In such a case, greater pressure loss occurs in the section SB and the amount of air bubbles Ba1 increases. Even in such a case, if the air-bubble capturing part F2 is provided at a position close to the nozzle 11, it is possible to effectively capture the air bubbles Ba1 generated in the piping.

FIG. 4 depicts graphs showing the amount of particles adhering to the substrate 9 processed by the substrate processing apparatus 10. In FIG. 4, the horizontal axis indicates the size of particles adhering to the substrate 9, and the vertical axis indicates the amount of particles adhering to the substrate 9 relative to the particle size. A graph 75 indicated by the solid line in FIG. 4 indicates the amount of particles adhering to the substrate 9 when the air-bubble capturing part F2 is provided in the supply piping 30, and a graph 77 indicated by the dashed double-dotted line indicates the amount of particles adhering to the substrate 9 when the air-bubble capturing part F2 is not provided.

As is clear from the graph 77 in FIG. 4, when the air-bubble capturing part F2 is omitted, a greater amount of particles with diameters smaller than 100 nm adheres to the substrate 9. On the other hand, as is clear from the graph 75, the provision of the air-bubble capturing part F2 suppresses adhesion of particles with diameters smaller than 100 nm to the substrate 9. This indicates that, although particles with diameters greater than 100 nm can almost be captured by the first filter F1 (with a pore diameter of 10 nm), particles with diameters smaller than 100 nm that could not be captured adhere to the substrate 9 due to the air bubbles Ba1 generated in the processing liquid that has passed through the first filter F1.

Conventional substrate processing apparatuses generally use a plurality of filters inserted in the supply piping to remove particles in the processing liquid transmitted from the processing-liquid supply part to the substrate processing apparatuses. In this case, the plurality of filters are inserted such that their pore diameters gradually decrease (i.e., the pressure loss gradually increases) from upstream of the supply piping to downstream. However, the provision of the plurality of filters increases the pressure loss in the supply piping and easily causes a situation where a large number of air bubbles Ba1 are generated in the processing liquid. As is clear from the graph 77 in FIG. 4, the presence of the air bubbles Ba1 in the processing liquid causes particles to aggregate on the air bubbles Ba1 and to adhere to the substrate 9 as a result of the air bubbles Ba1 coming in contact with the substrate 9.

In the present embodiment, for the purpose of removing these air bubbles Ba1, the air-bubble capturing part F2 is provided at a position between the first filter F1 and the nozzle 11 in the route of the supply piping 30 so that the air-bubble capturing part F2 can capture the air bubbles Ba1 generated in the processing liquid that has passed through the first filter F1. This effectively reduces the amount of particles adhering to the substrate 9, as indicated by the graph 75.

Moreover, the pore diameter of the second filter 51 of the air-bubble capturing part F2 is made greater than the pore diameter of the first filter F1 so that the pressure loss caused by the air-bubble capturing part F2 becomes smaller than that caused by the first filter F1. This makes it difficult for the air bubbles Ba1 to emerge in the processing liquid that has passed through the air-bubble capturing part F2, thus reducing the amount of particles adhering to the substrate 9. Thus, it can be said that the provision of the air-bubble capturing part F2 with a greater pore diameter (i.e., causes a smaller pressure loss) than the first filter F1 downstream of the first filter F1 for capturing particles is a technical idea based on a different concept from that of the conventional technical idea.

FIG. 5 depicts a graph 78 showing a correlation between the pressure loss caused by the second filter 51 and the amount of particles adhering to the substrate 9. In FIG. 5, the horizontal axis indicates the pressure loss, and the vertical axis indicates the amount of particles relative to the pressure loss.

Figure 6:
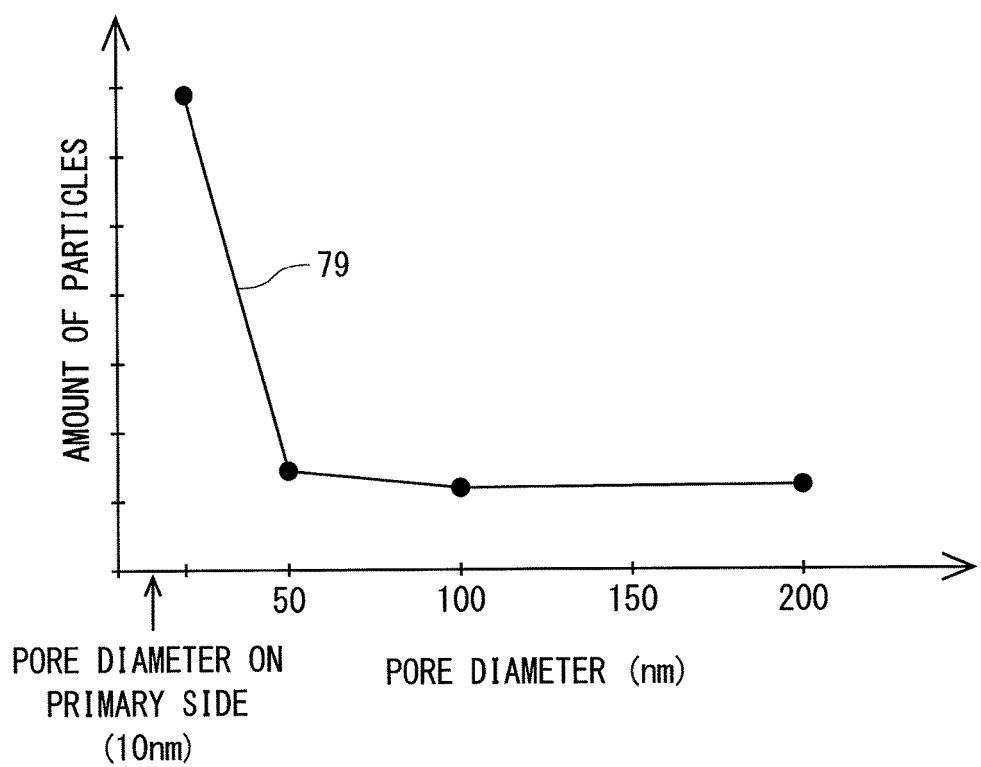
FIG. 6 depicts a graph showing a correlation between the pore diameter of the second filter and the amount of particles adhering to the substrate.

FIG. 6 depicts a graph 79 showing a correlation between the pore diameter of the second filter 51 and the amount of particles adhering to the substrate 9. In FIG. 6, the horizontal axis indicates the pore diameter, and the vertical axis indicates the amount of particles relative to the pore diameter.

The graphs 78 and 79 in FIGS. 5 and 6 indicate fluctuations in the amount of particles in the case of using four different types of second filters 51 having different pore diameters. Specifically, the second filters used respectively have pore diameters of 20 nm (53 kPa), 50 nm (20 kPa), 100 nm (12 kPa), and 200 nm (9 kPa). Note that the numerical values in parentheses each indicate the pressure loss. In FIGS. 5 and 6, particles with diameters of 26 nm or more are to be measured.

In the case of focusing on the pressure loss caused by the second filter 51, as is clear from the graph 78 in FIG. 5, the amount of particles considerably increases when the pressure loss caused by the second filter 51 is 53 kPa, which is greater than the pressure loss (18 kPa) caused by the first filter F1. It is, however, apparent that the amount of particles adhering to the substrate 9 is reduced by reducing the pressure loss caused by the second filter 51 to 20 kPa, which is approximately equal to the pressure loss (18 kPa) caused by the first filter F1, or to smaller values, e.g., 12 kPa or 9 kPa.

In the present invention, it is assumed that the pressure losses caused by the first filter F1 and the air-bubble capturing part F2 become approximately equal if the difference in pressure loss between the first filter F1 and the air-bubble capturing part F2 (specifically, the second filter 51) is smaller than or equal to one tenth of the pressure loss caused by the air-bubble capturing part F2.

In the case of focusing on the pore diameter of the second filter 51, as is clear from the graph 79 in FIG. 6, the amount of particles is reduced by making the pore diameter of the second filter 51 greater than the pore diameter (10 nm) of the first filter F1. In particular, a preferable case is where the pore diameter of the second filter 51 is greater than two times of the pore diameter (10 nm) of the first filter F1, and more preferably, the pore diameter of the second filter 51 is greater than or equal to five times of the pore diameter of the first filter F1.

2. Second Embodiment

In the above-described embodiment, the first filter F1 is provided outside the substrate processing apparatus 10, but the position of the first filter F1 is not limited to this position.

Figure 7:
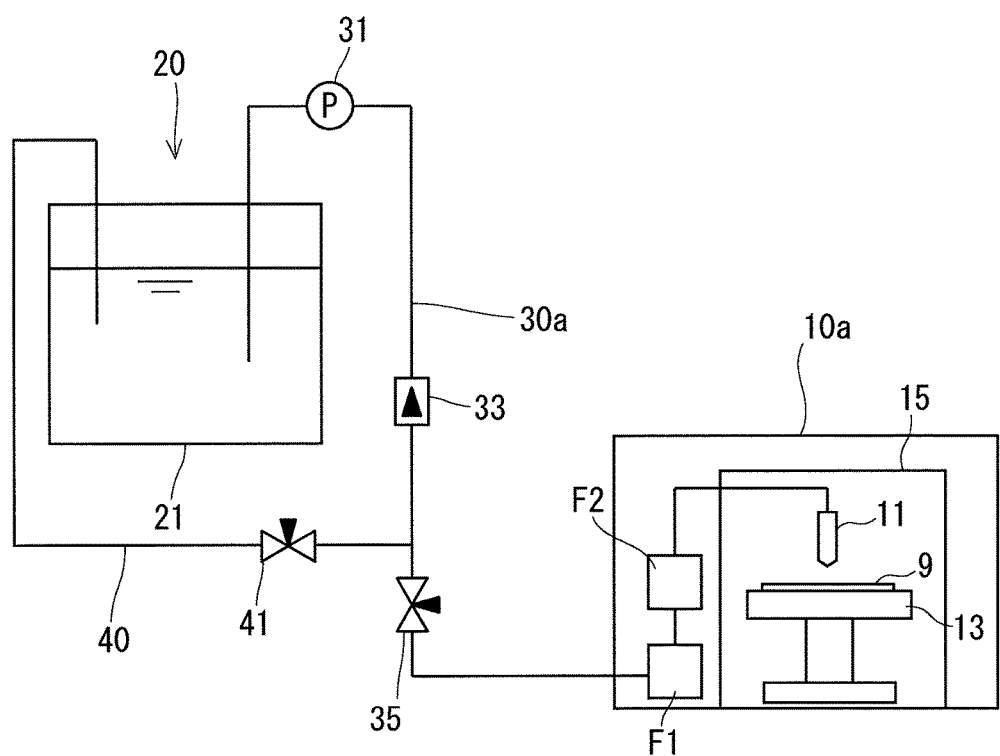
FIG. 7 is a general view illustrating an overview of a substrate processing apparatus and a processing-liquid supply part according to a second embodiment.

FIG. 7 is a general view illustrating an overview of a substrate processing apparatus 10a and a processing-liquid supply part 20 according to a second embodiment. As illustrated in FIG. 7, in the present embodiment, the substrate processing apparatus 10a and the processing-liquid supply part 20 are connected by supply piping 30a that connects the tank 21 and the nozzle 11. This supply piping 30a has approximately the same structure as the supply piping 30, but differs in that the first filter F1 is inserted in the supply piping 30a at a position inside the substrate processing apparatus 10a. To be more specific, the first filter F1 according to the present embodiment is inserted at a position between the supply valve 35 and the air-bubble capturing part F2, the position being closer to the air-bubble capturing part F2 than in the first embodiment.

Figure 8:
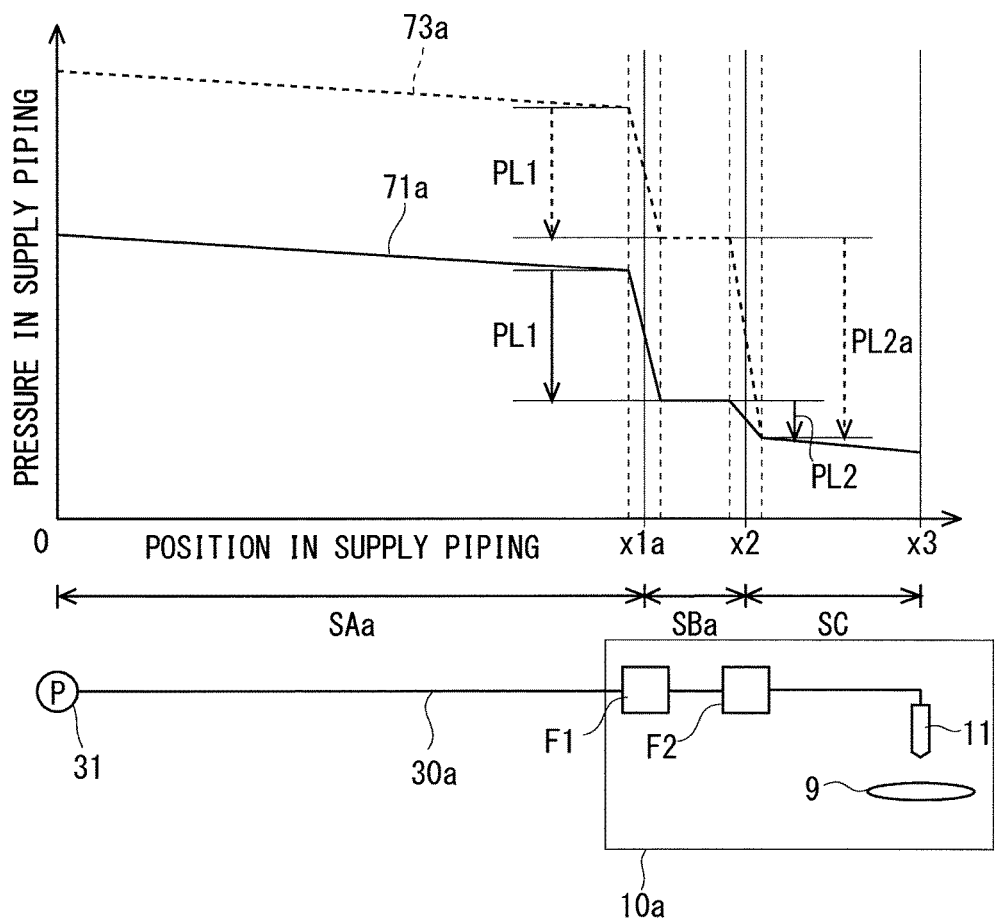
FIG. 8 depicts graphs showing the pressure at each position in the supply piping.

FIG. 8 depicts graphs showing the pressure at each position in the supply piping 30a. In FIG. 8, the horizontal axis indicates the position in the supply piping 30a, and the vertical axis indicates the pressure inside the supply piping 30a. In FIG. 8, x1a is the position at which the first filter F1 is provided in the supply piping 30a. Also, the section from the pump 31 to the first filter F1 in the supply piping 30a is represented by SAa, and the section from the first filter F1 to the air-bubble capturing part F2 is represented by SBa.

A graph 71a indicated by the solid line in FIG. 8 corresponds to a pressure change inside the supply piping 30a according to the second embodiment, i.e., a pressure change in the supply piping 30a when the pressure loss PL2 caused by the air-bubble capturing part F2a is smaller than the pressure loss PL1 caused by the first filter F1. On the other hand, a graph 73a indicated by the broken line corresponds to a pressure change inside the supply piping 30a in the case of employing an air-bubble capturing part (not shown) that causes the pressure loss PL2a greater than the pressure loss PL1 caused by the first filter F1.

As indicated by the graph 71a, the pressure inside the supply piping 30a changes in the same way as in the graph 71 in FIG. 3 even when the first filter F1 is located close to the air-bubble capturing part F2. That is, the pressure inside the supply piping 30a is highest at the position of the pump 31 serving as the pressure source, and is lowest at the position x3 of the nozzle 11 after having suffered the pressure losses PL1 and PL2a caused at the positions x1a and x2 and the pressure losses caused in the sections SAa and SBa.

On the other hand, in the case of using the air-bubble capturing part that causes the pressure loss PL2a greater than the pressure loss PL1 caused by the first filter F1, the total pressure loss increases as indicated by the graph 73a, and therefore, the pump 31 needs to apply greater pressure to the processing liquid. This causes problems such as upsizing of the pump 31, an increase in drive energy, and a rise in cost. There is also a possibility that a sharp increase in the pressure loss PL2a at the position x2 will produce the air bubbles Ba1 in the processing liquid that has passed through the air-bubble capturing part, and accordingly, increase the amount of particles adhering to the substrate 9. Thus, even when the first filter F1 is located close to the air-bubble capturing part F2, it is advantageous in terms of substrate processing to make the pressure loss PL2 caused by the air-bubble capturing part F2 as small as possible, as indicated by the graph 71a.

3. Third Embodiment

In the above-described embodiments, the air-bubble capturing part F2 is constituted by the second filter 51 and the deaerating mechanism 60 as illustrated in FIG. 2. However, the structure of the air-bubble capturing part F2 is not limited to this example.

Figure 9:
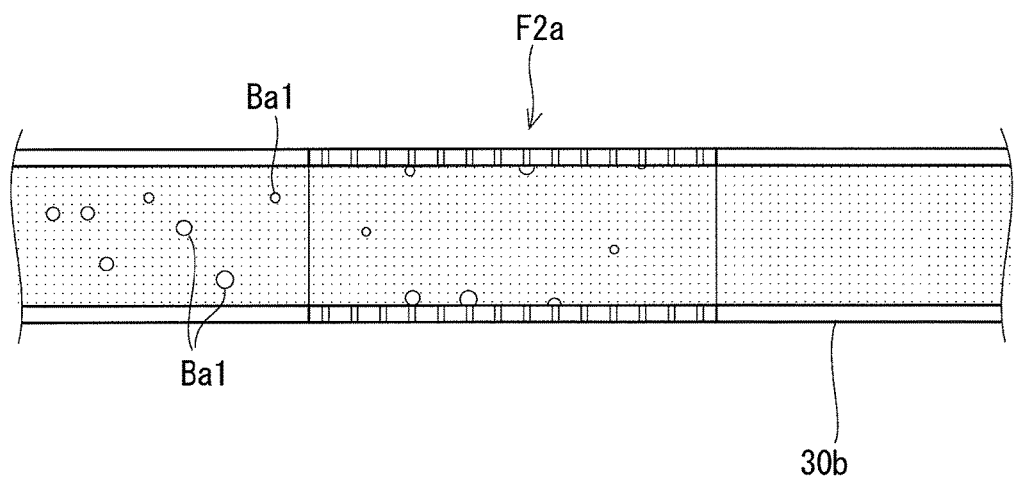
FIG. 9 is a schematic cross-sectional view of an air-bubble capturing part according to a third embodiment.
Figure 10:
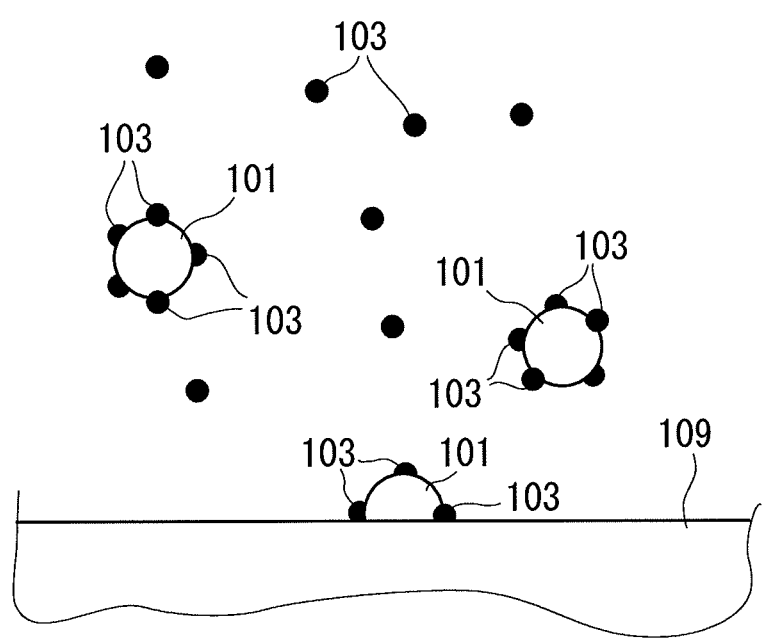
FIG. 10 is a conceptual diagram illustrating how air bubbles with particles adhering thereto adhere to the substrate.

FIG. 9 is a schematic cross-sectional view of an air-bubble capturing part F2a according to a third embodiment. The air-bubble capturing part F2a is provided instead of the air-bubble capturing part F2 in FIG. 2. As illustrated in FIG. 9, the air-bubble capturing part F2a is inserted in supply piping 30b that connects the tank 21 and the nozzle 11. The air-bubble capturing part F2a is primarily configured of a hollow fiber membrane (not shown) formed of a bundle of straw-shaped hollow fibers. The outer side of the hollow fiber membrane is decompressed by a vacuum pump, which is not shown. Thus, when the processing liquid passes through the air-bubble capturing part F2a, the air bubbles Ba1 (or dissolved gases) in the processing liquid are released to the outside through the hollow fiber membrane.

Like the air-bubble capturing part F2, the air-bubble capturing part F2a can also remove the air bubbles Ba1 in the processing liquid. The pressure loss caused by the air-bubble capturing part F2a is smaller than the pressure loss caused by the air-bubble capturing part F2 using the filter. It is thus possible to suppress the generation of air bubbles in the processing liquid that has passed through the air-bubble capturing part F2a. Note that from the viewpoint of reliably capturing the air bubbles Ba1, the air-bubble capturing part F2 including the second filter 51 is more effective than the air-bubble capturing part F2a.

4. Variations

While the above has been a description of embodiments, the present invention is not limited to the embodiments described above and can be modified in various ways.

For example, the air-bubble capturing part F2, which is provided outside the chamber 15 in the above-described embodiments as illustrated in FIG. 1 or 7, may be provided inside the chamber 15.

While only one first filter F1 is provided for particle removal in the examples in FIGS. 1 and 3, a plurality of filters may be inserted in the supply piping 30 or 30a. Alternatively, other filters (e.g., an ion removing filter) for use in different purposes other than particle removal may be inserted in the supply piping 30 or 30a.

The configurations of the above-described preferred embodiments and variations may be appropriately combined as long as there are no mutual inconsistencies.

DESCRIPTION OF REFERENCE SIGNS 10, 10a Substrate processing apparatus
Ba1, 101 Air bubble
103 Particle
9, 109 Substrate
11 Nozzle
13 Rotation stage
15 Chamber
20 Processing-liquid supply part
21 Tank
30, 30a, 30b Supply piping
31 Pump
40 Circulating piping
51 Second filter
53 Film
55 Pore
60 Deaerating mechanism
F1 First filter
F2, F2a Air-bubble capturing part
SA, SB, SC Section

The invention claimed is:

1. A substrate processing apparatus for processing a substrate by ejecting a processing liquid, comprising:
an ejection part that ejects a processing liquid toward said substrate;
supply piping having one end connected to a processing-liquid supply part via a first filter and the other end connected to said ejection part, said processing-liquid supply part supplying said processing liquid, and said first filter removing particles; and
an air-bubble capturing part that is inserted at a position between said first filter and said ejection part in said supply piping and captures air bubbles generated in said processing liquid by passing through said first filter,
wherein pressure loss caused by said air-bubble capturing part is approximately equal to or smaller than pressure loss caused by said first filter,
said air-bubble capturing part includes a second filter, said air-bubble capturing part being configured to capture air bubbles generated until said processing liquid that has passed through said first filter reaches said air-bubble capturing part, said first filter and said second filter are directly connected to each other through said supply piping, the pressure loss of said second filter of said air-bubble capturing part is smaller than that of said first filter, a distance from said air-bubble capturing part to said ejection part in said supply piping is shorter than a distance from a pressure source to said air-bubble capturing part in said supply piping, said pressure source applying pressure to said processing liquid, said air-bubble capturing part includes a deaerating mechanism that releases air bubbles to the outside, and between said air-bubble capturing part and said ejection part in said supply piping, no valve is provided for opening or closing said flow path of said supply piping.

2. The substrate processing apparatus according to claim 1, wherein the pore diameter of said first filter is 10 nm, and the pore diameter of said second filter ranges from 50 nm to 200 nm.

3. The substrate processing apparatus according to claim 1, further comprising:
a supply valve that controls the supply of said processing liquid from said processing-liquid supply part to said ejection part by opening or closing, the flow path of said supply piping,
wherein said supply valve is positioned closer to said processing-liquid supply part than said air-bubble capturing part in said supply piping.

4. The substrate processing apparatus according to claim 3, wherein
said first filter is inserted at a position between said supply valve and said air-bubble capturing part in said supply piping.

5. The substrate processing apparatus according to claim 1, wherein
a pore diameter of said second filter is greater than or equal to two times a pore diameter of said first filter.

6. The substrate processing apparatus according to claim 1, wherein
a pressure source that forcedly feeds a processing liquid from said processing liquid supply part to said ejection part;
in said supply piping, a pressure of a section between said first filter and said second filter is lower than a pressure of a section between said pressure source and said first filter, and greater than a pressure of a section between said second filter and said ejection part.

7. The substrate processing apparatus according to claim 1, wherein
a pressure in a section between said first filter and said second filter in said supply piping is uniformly reduced.

8. A substrate processing apparatus for processing a substrate by ejecting a processing liquid, comprising:
an ejection part that ejects a processing liquid toward said substrate;
supply piping having one end connected to a processing-liquid supply part via a first filter and the other end connected to said ejection part, said processing-liquid supply part supplying said processing liquid, and said first filter removing particles; and
an air-bubble capturing part that is inserted at a position between said first filter and said ejection part in said supply piping and captures air bubbles generated in said processing liquid by passing through said first filter, said air-bubble capturing part being configured to capture air bubbles generated until said processing liquid that has passed through said first filter reaches said air-bubble capturing part;

wherein pressure loss caused by said air-bubble capturing part is approximately equal to or smaller than pressure loss, caused by said first filter, the pressure loss caused by each of said first filter and said air-bubble capturing part is equal to or smaller than 20 kPa, said first filter and said air-bubble capturing part are directly connected to each other through said supply piping, said air-bubble capturing part includes a second filter, the pressure loss of said second filter of said air-bubble capturing part is smaller than that of said first filter, a distance from said air-bubble capturing part to said ejection part in said supply piping is shorter than a distance from a pressure source to said air-bubble capturing part in said supply piping, said pressure source applying pressure to said processing liquid, said air-bubble capturing part includes a deaerating mechanism that releases air bubbles to the outside, and between said air-bubble capturing part and said ejection part in said supply piping, no valve is provided for opening or closing said flow path of said supply piping.

9. A substrate processing apparatus for processing a substrate by ejecting a processing liquid, comprising:
an ejection part that ejects a processing liquid toward said substrate;
supply piping having one end connected to a processing-liquid supply part via a first filter and the other end connected to said ejection part, said processing-liquid supply part supplying said processing liquid, and said first filter removing particles; and
an air-bubble capturing part that is inserted at a position between said first filter and said ejection part in said supply piping and captures air bubbles generated in said processing liquid by passing through said first filter, said air-bubble capturing part being configured to capture air bubbles generated until said processing liquid that has passed through said first filter reaches said air-bubble capturing part;

wherein pressure loss caused by said air-bubble capturing part is approximately equal to or smaller than pressure loss caused by said first filter, said processing liquid is an ammonia-hydrogen peroxide mixture, said first filter and said air-bubble capturing part are directly connected to each other through said supply piping, said air-bubble capturing part includes a second filter, the pressure loss of said second filter of said air-bubble capturing part is smaller than that of said first filter, a distance from said air-bubble capturing part to said ejection part in said supply piping is shorter than a distance from a pressure source to said air-bubble capturing part in said supply piping, said pressure source applying pressure to said processing liquid, said air-bubble capturing part includes a deaerating mechanism that releases air bubbles to the outside, and between said air-bubble capturing part and said ejection part in said supply piping, no valve is provided for opening or closing said flow path of said supply piping.

* * * * *